(12) United States Patent
Fu et al.

(10) Patent No.: US 8,555,092 B2
(45) Date of Patent: Oct. 8, 2013

(54) MEMORY POWER SUPPLY CONTROL CIRCUIT

(75) Inventors: Ying-Bin Fu, Shenzhen (CN); Lan-Yi Feng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 413 days.

(21) Appl. No.: 12/967,021

(22) Filed: Dec. 13, 2010

(65) Prior Publication Data

US 2012/0144212 A1 Jun. 7, 2012

(30) Foreign Application Priority Data

Dec. 4, 2010 (CN) .......................... 2010 1 0573099

(51) Int. Cl.
*G06F 1/00* (2006.01)
*G06F 1/26* (2006.01)
*G06F 1/32* (2006.01)
*G05F 1/00* (2006.01)

(52) U.S. Cl.
USPC ............ 713/300; 713/320; 713/324; 323/283

(58) Field of Classification Search
USPC .......................... 713/300, 320, 324; 323/283
See application file for complete search history.

(56) References Cited

U.S. PATENT DOCUMENTS

| 2003/0021128 A1* | 1/2003 | Brkovic .......................... 363/17 |
| 2010/0001703 A1* | 1/2010 | Williams ....................... 323/283 |
| 2010/0005330 A1* | 1/2010 | Taylor et al. .................. 713/340 |
| 2010/0164470 A1* | 7/2010 | Lee ............................... 323/351 |

* cited by examiner

*Primary Examiner* — Kim Huynh
*Assistant Examiner* — Brandon Kinsey
(74) *Attorney, Agent, or Firm* — Altis & Wispro Law Group, Inc.

(57) ABSTRACT

A memory power supply control circuit includes a number of memory slots, a platform controller hub (PCH), a first synchronous rectification driver, a number of second synchronous rectification drivers, and a complex programmable logic device (CPLD). The PCH is connected to the memory slots. The first synchronous rectification driver maintains a working state at all time. The CPLD is connected between the PCH and the second synchronous rectification drivers. The CPLD receives information from the PCH to determine a number of used memory slots, and controls the working states of the second synchronous rectification drivers according to the number of used memory slots.

1 Claim, 1 Drawing Sheet

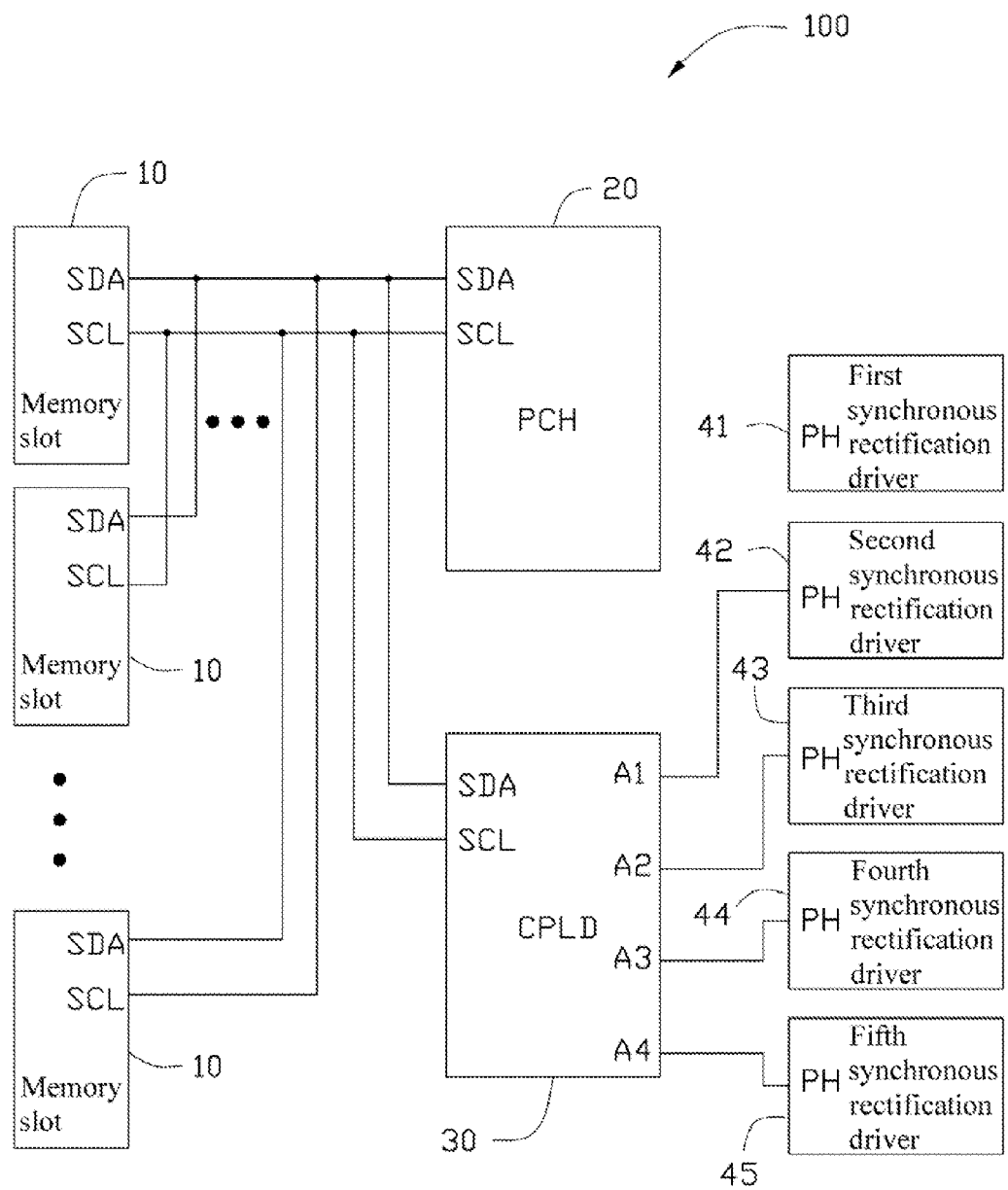

MEMORY POWER SUPPLY CONTROL CIRCUIT

BACKGROUND

1. Technical Field

The present disclosure relates to a memory power supply control circuit.

2. Description of Related Art

Memory components or chips (hereinafter memory chips) are installed in memory slots of motherboards of computers or servers. The number of memory chips inserted in the memory slots can be adjusted according to requirements. In a common memory power supply control circuit, a number of synchronous rectification drivers are provided to supply power to the memory chips through a power circuit. The memory slots of a motherboard may not all be used at the same time, however, all of the synchronous rectification drivers still work to supply power, and thereby electricity may be wasted.

BRIEF DESCRIPTION OF THE DRAWING

Many aspects of the present embodiments can be better understood with reference to the following drawing. The components in the drawings are not necessarily drawn to scale, the emphasis instead being placed upon clearly illustrating the principles of the present embodiments.

The drawing is a circuit diagram of an embodiment of a memory power supply control circuit.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to drawing, an embodiment of a memory power supply control circuit 100 includes a plurality of memory slots 10 used to install memory chips (not shown), a platform controller hub (PCH) 20, a complex programmable logic device (CPLD) 30, and first to fifth synchronous rectification drivers 41-45. In other embodiments, the number of the synchronous rectification drivers can be changed according to requirements.

Each memory slot 10 includes a data pin SDA and a clock pin SCL. The PCH 20 and the CPLD 30 each also include a data pin SDA and a clock pin SCL correspondingly. The data pin SDA and clock pin SCL of each memory slot 10 are respectively connected to the data pin SDA and clock pin SCL of the PCH 20 through system management buses (SMBus). The data pin SDA and clock pin SCL of the PCH 20 are respectively connected to the data pin SDA and clock pin SCL of the CPLD 30. The PCH 20 communicates with the memory chips installed in the memory slots 10 through the SMBus. The first to fifth synchronous rectification drivers 41-45 are used to supply power to the memory chips installed in the memory slots 10 through a power circuit (not shown), which falls within well-known technologies, and is therefore not described here.

The CPLD 30 includes four data output pins A1-A4, respectively connected to phase pins PH of the second to fifth synchronous rectification drivers 42-45. A phase pin PH of the first synchronous rectification driver 41 is idle, which can make the first synchronous rectification driver 41 maintain a working state at all time. The CPLD 30 receives information from the PCH 20, to determine the number of the memory chips installed in the memory slots 10, and control working states of the second to fifth synchronous rectification drivers 42-45 according to number of the memory chips installed in the memory slots 10.

For example, in one embodiment, the number of the memory slots 10 is nine. If the number of the memory chips installed in the memory slots 10 is less than or equal to one, the CPLD 30 doesn't control the second to fifth synchronous rectification drivers 42-45 to work. If the number of the memory chips installed in the memory slots 10 is greater than one but less than or equal to three, the CPLD 30 only controls the second synchronous rectification driver 42 to work. If the number of the memory chips installed in the memory slots 10 is greater than three but less than or equal to five, the CPLD 30 only controls the second and third synchronous rectification drivers 42 and 43 to work. If the number of the memory chips installed in the memory slots 10 is greater than five but less than or equal to seven, the CPLD 30 only controls the second to fourth synchronous rectification drivers 42-44 to work. If the number of the memory chips installed in the memory slots 10 is greater than seven, the CPLD 30 controls the second to fifth synchronous rectification drivers 42-45 to work.

For implementing the above requirements, the CPLD 30 may be programmed as follows. The data output pins A1-A4 may output two kinds of control signal, namely a high voltage signal (hereinafter "1") such as 5 volts (V) and a low voltage signal (hereinafter "0") such as 0V. If the number of the memory chips installed in the memory slots 10 is less than or equal to one, the data output pins A1-A4 respectively output "0", "0", "0", and "0". If the number of the memory chips installed in the memory slots 10 is greater than one but less than or equal to three, the data output pins A1-A4 respectively output "0", "0", "0", and "1". If the number of the memory chips installed in the memory slots 10 is greater than three but less than or equal to five, the data output pins A1-A4 respectively output "0", "0", "1", and "1". If the number of the memory chips installed in the memory slots 10 is greater than five but less than or equal to seven, the data output pins A1-A4 respectively output "0", "1", "1", and "1". If the number of the memory chips installed in the memory slots 10 is greater than seven, the data output pins A1-A4 respectively output "1", "1", "1", and "1".

The memory power supply control circuit 100 can control the working states of the second to fifth synchronous rectification drivers 42-45 according to the number of the memory chips installed in the memory slots 10 through the CPLD 30, therefore power can be saved.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A memory power supply control circuit comprising:
   a plurality of memory slots;
   a platform controller hub (PCH) connected to the plurality of memory slots;
   a first synchronous rectification driver maintaining a working state at all time;
   a plurality of second synchronous rectification drivers; and
   a complex programmable logic device (CPLD) connected between the PCH and the plurality of second synchronous rectification drivers, the CPLD receiving information from the PCH to determine a number of used memory slots of the plurality of memory slots, and controlling working states of the plurality of second synchronous rectification drivers according to the number of used memory slots of the plurality of memory slots;

wherein the number of the plurality of memory slots is nine, the number of the second synchronous rectification drivers is four; if the number of the used memory slots is less than or equal to one, data output pins of the CLPD respectively output "0", "0", "0", and "0" to the second synchronous rectification drivers, thereby no second synchronous rectification driver working; if the number of the used memory slots is greater than one but less than or equal to three, the data output pins of the CLPD respectively output "0", "0", "0", and "1" to the second synchronous rectification drivers to control one second synchronous rectification driver to work; if the number of the used memory slots is greater than three but less than or equal to five, the data output pins of the CLPD respectively output "0", "0", "1", and "1" to the second synchronous rectification drivers to control two second synchronous rectification drivers to work; if the number of the used memory slots is greater than five but less than or equal to seven, the data output pins of the CLPD respectively output "0", "1", "1", and "1" to the second synchronous rectification drivers to control three second synchronous rectification drivers to work; if the number of the used memory slots is greater than seven, the data output pins of the CLPD respectively output "1", "1", "1", and "1" to the second synchronous rectification drivers to control four second synchronous rectification drivers to work; wherein "1" stands for a high voltage signal and "0" stands for a low voltage signal.

* * * * *